(12) United States Patent
Hwang et al.

(10) Patent No.: US 7,227,591 B2
(45) Date of Patent: Jun. 5, 2007

(54) APPARATUS AND METHOD FOR RECEIVING TELEVISION AND RADIO BROADCASTING SIGNALS USING A SINGLE TUNER

(75) Inventors: Tae-don Hwang, Suwon-si (KR); Hong-seok Jeong, Uijeonglou-si (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 792 days.

(21) Appl. No.: 10/675,941

(22) Filed: Oct. 2, 2003

(65) Prior Publication Data

US 2004/0088725 A1   May 6, 2004

(30) Foreign Application Priority Data

Nov. 1, 2002   (KR) ...................... 10-2002-0067397

(51) Int. Cl.
*H04N 5/44* (2006.01)
*H04N 5/46* (2006.01)
*H04N 5/50* (2006.01)

(52) U.S. Cl. ...................... 348/729; 348/725; 348/726; 348/738

(58) Field of Classification Search ................ 348/729, 348/725, 726, 738, 735, 736, 553; 455/188.1, 455/179.1, 180.1, 196.1, 161.2
See application file for complete search history.

(56) References Cited

U.S. PATENT DOCUMENTS

| | | | | |
|---|---|---|---|---|
| 4,660,087 A | * | 4/1987 | Rumreich | 348/737 |
| 5,142,369 A | * | 8/1992 | Grubbs et al. | 348/729 |
| 5,142,370 A | * | 8/1992 | Wignot et al. | 348/729 |
| 5,144,439 A | * | 9/1992 | Wignot | 348/729 |
| 5,144,440 A | * | 9/1992 | Wignot et al. | 348/729 |
| 5,146,338 A | * | 9/1992 | Lehmann et al. | 348/729 |
| 5,148,280 A | * | 9/1992 | Wignot et al. | 348/729 |
| 5,164,830 A | * | 11/1992 | Kim | 348/738 |
| 5,361,406 A | * | 11/1994 | Wignot et al. | 455/200.1 |
| 5,440,351 A | * | 8/1995 | Ichino | 348/729 |
| 5,710,993 A | * | 1/1998 | Brekelmans | 455/188.1 |
| 5,737,034 A | * | 4/1998 | Rhee | 348/738 |

(Continued)

FOREIGN PATENT DOCUMENTS

JP   2002-44560 A   2/2002

(Continued)

*Primary Examiner*—David Ometz
*Assistant Examiner*—Jean W. Désir
(74) *Attorney, Agent, or Firm*—Sughrue Mion, PLLC

(57) ABSTRACT

There is provided a combined TV and FM radio receiver for selectively receiving TV and FM radio signals via a single tuner using a digital intermediate frequency (IF) stage. The receiver includes a tuner that selects TV band or FM radio band signals and converts the selected signals into IF signals or primary sound IF signals; an IF processor that generates local oscillating signals depending on whether a current mode is a TV mode or an FM radio mode, and converts the IF signals and/or primary sound IF signals, into baseband signals and secondary sound IF signals, respectively; a video demodulator that extracts video signals; an audio demodulator that extracts TV audio signals and FM radio signals according to TV sound or FM radio mode data; and a controller that controls the tuner, and the IF processor, and applies the TV sound or FM radio mode data to the audio demodulator.

8 Claims, 5 Drawing Sheets

U.S. PATENT DOCUMENTS

| | | | |
|---|---|---|---|
| 6,061,096 A * | 5/2000 | Limberg | 348/555 |
| 6,125,269 A * | 9/2000 | Brekelmans | 455/180.1 |
| 6,166,776 A * | 12/2000 | Moon | 348/555 |
| 6,188,439 B1 * | 2/2001 | Kim | 348/553 |
| 6,211,925 B1 * | 4/2001 | Kikuchi | 348/729 |
| 6,633,345 B2 * | 10/2003 | Izuta et al. | 348/729 |
| 6,721,017 B2 * | 4/2004 | Yamamoto | 348/729 |
| 6,731,348 B2 * | 5/2004 | Osada et al. | 348/729 |
| 6,795,128 B2 * | 9/2004 | Yamamoto | 348/729 |
| 6,876,401 B2 * | 4/2005 | Yamamoto | 348/729 |
| 7,002,638 B2 * | 2/2006 | Yeo et al. | 348/729 |
| 7,068,322 B2 * | 6/2006 | Tsubouchi | 348/485 |

FOREIGN PATENT DOCUMENTS

| | | |
|---|---|---|
| KR | 1992-0005625 A | 3/1992 |

* cited by examiner

APPARATUS AND METHOD FOR RECEIVING TELEVISION AND RADIO BROADCASTING SIGNALS USING A SINGLE TUNER

BACKGROUND OF THE INVENTION

This application claims the priority of Korean Patent Application No. 2002-67397, filed on Nov. 1, 2002, in the Korean Intellectual Property Office, the disclosure of which is incorporated herein in its entirety by reference.

1. Field of the Invention

The present invention relates to a combined TV (television) and FM (frequency modulation) radio receiver and a method to receive TV and FM radio signals, and more particularly, to a combined TV and FM radio receiver capable of, and a method for, selectively receiving TV and FM radio signals via a single tuner using a digital IF (intermediate frequency) stage.

2. Description of the Related Art

A TV receiver for receiving broadcasting signals, e.g., TV signals and FM radio signals, transmitted in different frequency bands typically includes a plurality of tuners in correspondence with the respective frequency bands and a plurality of detection circuits for detecting signals selected via the respective tuners.

FIG. 1 is a block diagram of a conventional combined TV and FM radio receiver. Referring to FIG. 1, a TV tuner 110 converts TV signals received via an antenna into IF signals. A video band filter 112 extracts video band signals from the IF signals output from the TV tuner 110. A video IF converter 116 coverts the video signals extracted by the video band filter 112 into video baseband signals. A video demodulator 120 extracts composite video baseband signals (CVBS) from the baseband signals output from the video IF converter 116. A video processor 122 converts the composite video baseband signals extracted by the video demodulator 120 into red (R), green (G), and blue (B) color signals and outputs them via a CRT (cathode ray tube) 124.

An audio band filter 114 extracts audio band signals from the IF signals output from the TV tuner 110. An audio IF converter 118 converts the audio signals extracted by the audio band filter 114 into audio baseband signals.

Meanwhile, a radio tuner 132 receives FM radio signals via another antenna. An amplifier 134 amplifies the FM radio signals received via the radio tuner 132. A radio IF converter 136 converts the FM radio signals amplified via the amplifier 134 into IF band signals. An audio demodulator 142 extracts and demodulates audio signals from the audio baseband signals extracted by the audio IF converter 118 and the IF band signals extracted by the IF converter 136. A sound processor 144 amplifies the audio signals demodulated by the audio demodulator 142 and outputs them via a speaker 146.

As described above, the conventional combined TV and FM radio receiver has required not only a TV tuner but also a separate radio tuner and other radio signal processing elements, such as an amplifier, a radio IF converter, etc. Accordingly, the structure of the conventional receiver is complex and the production cost thereof is high.

SUMMARY OF THE INVENTION

The present invention provides a combined TV and FM radio receiver capable of receiving TV signals as well as FM radio signals via a single unit in which conventional elements, such as a TV tuner, a radio tuner, IF converts for TV signals, and a radio IF converter, are integrated so that the production cost of the receiver can be lowered and the usability thereof can be improved.

According to an aspect of the present invention, there is provided a combined TV (television) and FM (frequency modulation) radio receiver, comprising: a tuner that selects TV band or FM radio band signals and converts the selected TV band signals or FM radio band signals into IF signals and/or primary sound IF signals; an IF (intermediate frequency) processor that generates different local oscillating signals depending on whether a current mode is a TV mode or an FM radio mode, and converts the IF signals and/or primary sound IF signals, which are converted by the tuner, into base band signals and secondary sound IF signals, respectively; a video demodulator that extracts video signals from the IF band signals processed via the IF processor; an audio demodulator that extracts either TV audio signals or FM radio signals from the baseband signals and/or secondary sound IF signals processed via the IF processor according to a TV sound or FM radio mode data; and a controller that controls the selection of the tuner based on TV channel selection data or FM radio channel selection data, controls the IF processor to generate different local oscillating frequency depending on whether a current mode is a TV mode or an FM radio mode, and applies the TV sound or FM radio mode data to the audio demodulator.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF THE INVENTION

An exemplary embodiment of the present invention will now be described with reference to FIGS. 2 through 5.

Figure 1:
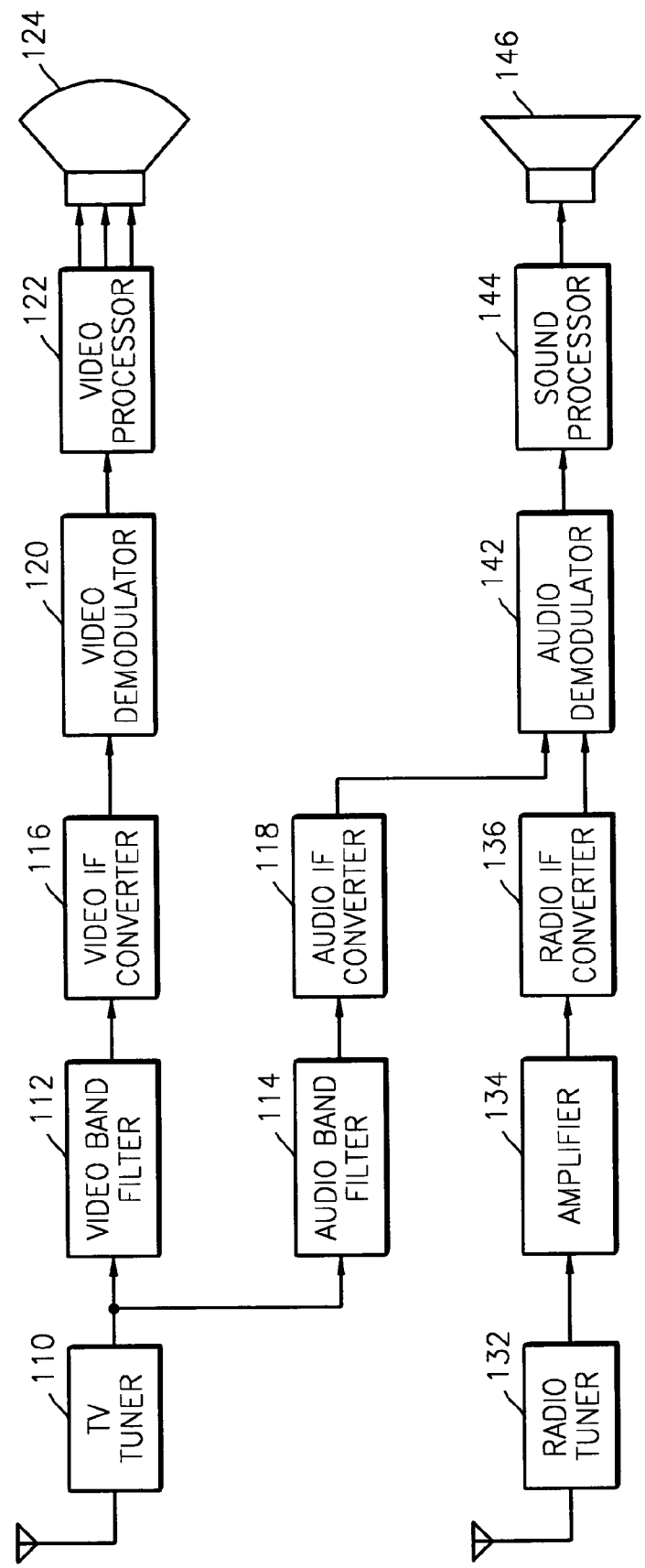
FIG. 1 is a block diagram of a conventional combined TV and FM radio receiver.
Figure 2:
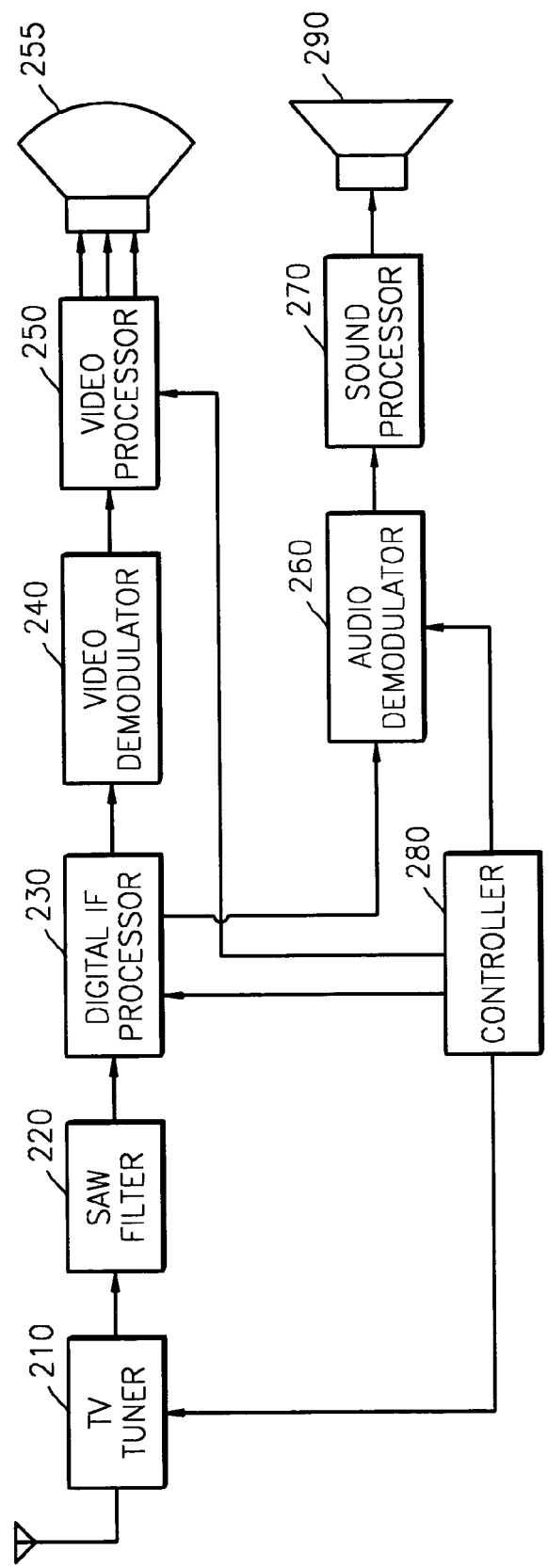
FIG. 2 is a block diagram of a combined TV and FM radio receiver using a single tuner according to an embodiment of the present invention.

FIG. 2 is a block diagram of a combined TV and FM radio receiver using a single tuner according to the present invention. Referring to FIG. 2, a tuner 210 selects TV band signals and/or FM radio band signals according to a channel selection signal output from a controller 280 and converts RF TV and/or FM radio band signals received via an antenna into IF signals. For example, in a TV mode, RF signals in a frequency band of 500–800 MHz are converted into 38.9 MHz signals that correspond to video IF signals. Also, in a FM radio mode, the RF signals in a frequency band of 88–108 MHz are converted into 33.4 MHz signals that correspond to primary sound IF band signals.

A SAW (surface acoustic wave) filter 220 filters TV video/sound band signals and FM sound band signals from the IF signals converted output from the tuner 210. Here, the SAW filter 220 has a broader filtering band, e.g., 8 MHz, than a filter used in a conventional TV receiver to sufficiently cover the TV video/sound band signals and FM sound band signals.

A digital IF processor 230 converts the filtered IF signals output from the SAW filter 220 into baseband signals and secondary sound IF band (SIF) signals, in response to a control signal that is differently generated by the controller 280 depending on whether a current mode is a TV mode or a FM radio mode. For example, in a case of a PAL-I system, the IF signals at 38.9 MHz output from the tuner 210 are applied to the digital IF processor 230 and are converted into baseband signals having a bandwidth of 8 MHz via the digital IF processor 230. Also, in the FM radio mode, the digital IF processor 230 converts the primary sound IF signals into 5.5 MHz signals that correspond to secondary sound IF band signals, irrespective of whether an input signal is an FM radio signal or a TV sound signal.

A video demodulator 240 extracts composite video baseband signals (CVBS) from the baseband signals output from the digital IF processor 230. A video processor 250 converts the composite video baseband signals extracted by the video demodulator 240 as well as on-screen display (OSD) signals, such as, background image signals or radio output message signals, produced via the controller 280 into R, G, and B color signals and outputs them via a CRT 255.

An audio demodulator 260 extracts TV audio signals or radio audio signals from the sound IF signals output from the digital IF processor 230 according to a TV or radio sound mode output from the controller 280. For example, the TV sound IF signals are converted into the baseband signals via quadrature demodulation and the FM sound IF signals are converted into the baseband signals via an FM PLL (phase locked loop) demodulation. In particular, the audio demodulator 260 extracts the TV audio signals or radio audio signals from the sound IF signals, in a secondary sound IF band, that is output from the digital IF processor 230.

A sound processor 270 amplifies the audio signals demodulated by the audio demodulator 260 and outputs them via a speaker 290.

Figure 5:
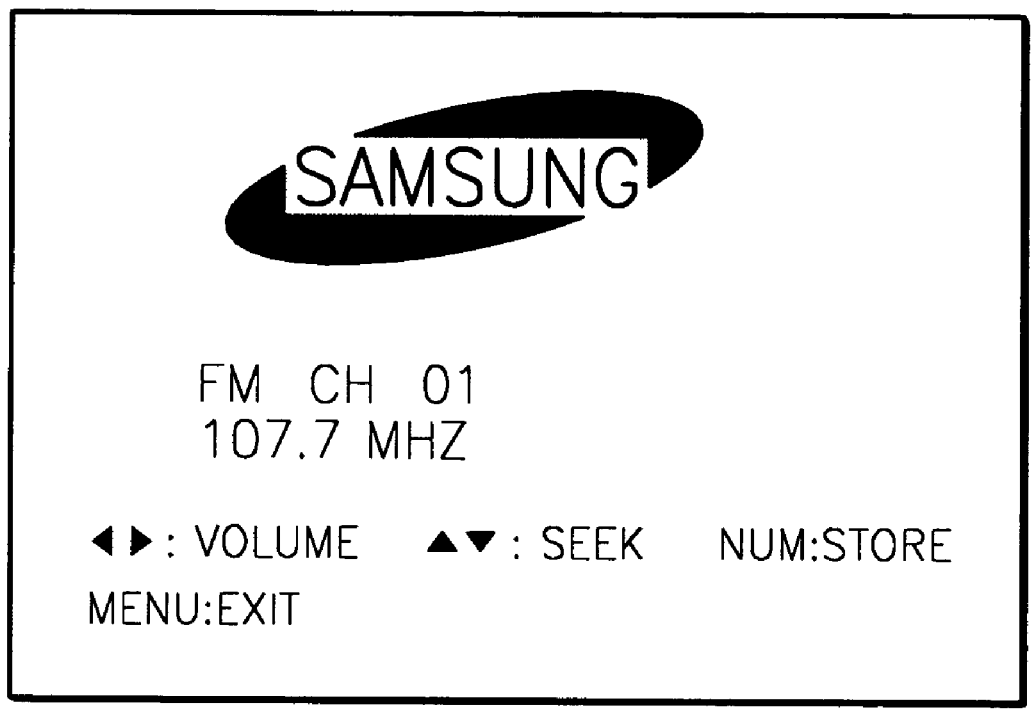
FIG. 5 shows an example of a TV screen when a user selects an FM radio mode.

The controller 280 stores TV band channel selection data and FM radio band channel selection data. When a key signal corresponding to a channel selection instruction is received via a remote control (not shown), the controller 280 provides the channel selection data in a channel selection signal, and frequency control data in a frequency control signal to the tuner 210 and the digital IF processor 230, respectively. Further, the controller 280 applies a TV sound mode instruction or a radio mode instruction to the audio demodulator 260 according to the sound mode selected by a user so that the audio demodulation suitable for the selected sound mode can be performed. In addition, when a FM radio mode instruction is received from the user, the controller 280 outputs the background image data signals or radio output message data signals via the video processor 250 and controls the tuner 210 to receive FM radio signals. For example, when the FM radio mode is set by the user, the controller 280 produces predetermined OSD (on-screen display) information on the corresponding channel, which is displayed on a TV screen as shown in FIG. 5.

Figure 3:
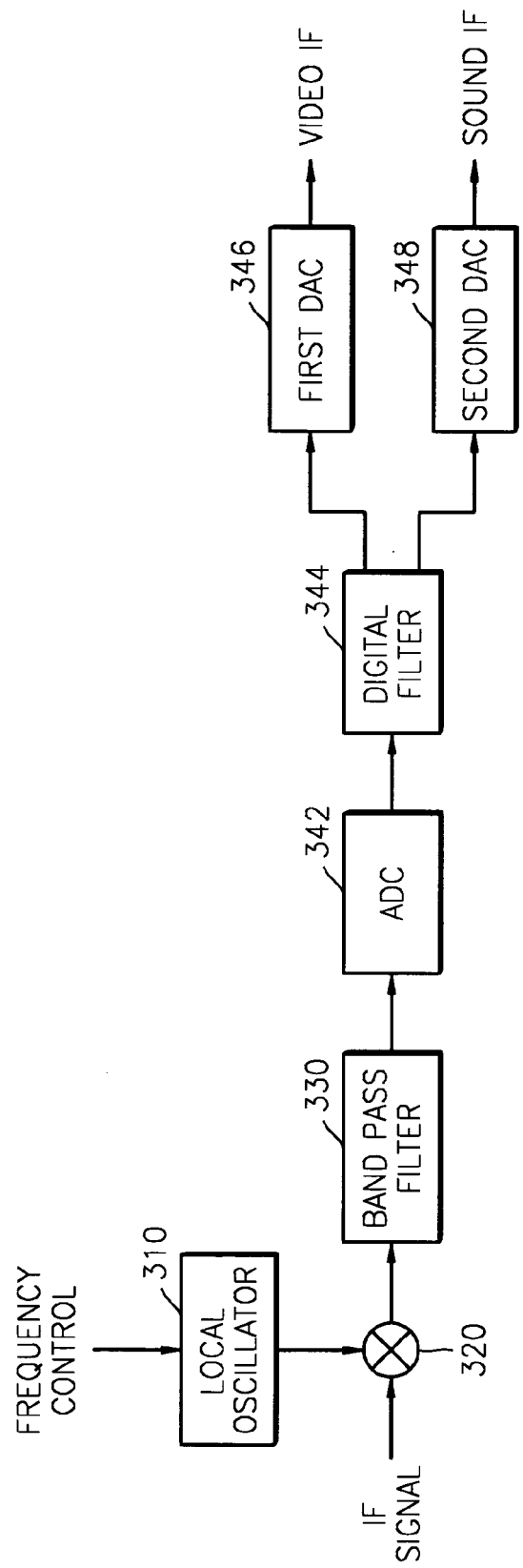
FIG. 3 is a more detailed block diagram of the digital IF processor shown in FIG. 2.

FIG. 3 is a more detailed block diagram of the digital IF processor 230 shown in FIG. 2. Referring to FIG. 3, a local oscillator 310 generates oscillating signal suited for a TV system, e.g., PAL-I, PAL/SECOM B/G, or NTSC, or an FM radio according to frequency control signals produced by the controller 280. A mixer 320 mixes the oscillating frequency generated by the local oscillator 310 with the filtered IF signals output from the SAW filter 220. For, example, the mixer 320 outputs 8 MHz signals by mixing 38.9 MHz IF signals with 30.9 MHz oscillating signals in the PAL-I system, 7 MHz signals by mixing 38.9 MHz IF signals with 31.9 MHz oscillating signals in the PAL/SECOM B/G system, and 6 MHz signals by mixing 38.9 MHz IF signals with 32.9 MHz oscillating signals in the NTSC system. Also, when a sound signal is input to the mixer 320, the mixer 320 outputs 5.5 MHz signals, which correspond to secondary SIF band signals, by mixing 33.4 MHz IF signals in a primary SIF band with 27.9 MHz oscillating signals. The secondary SIF band signals are output directly to the audio demodulator 260.

Figure 4A:
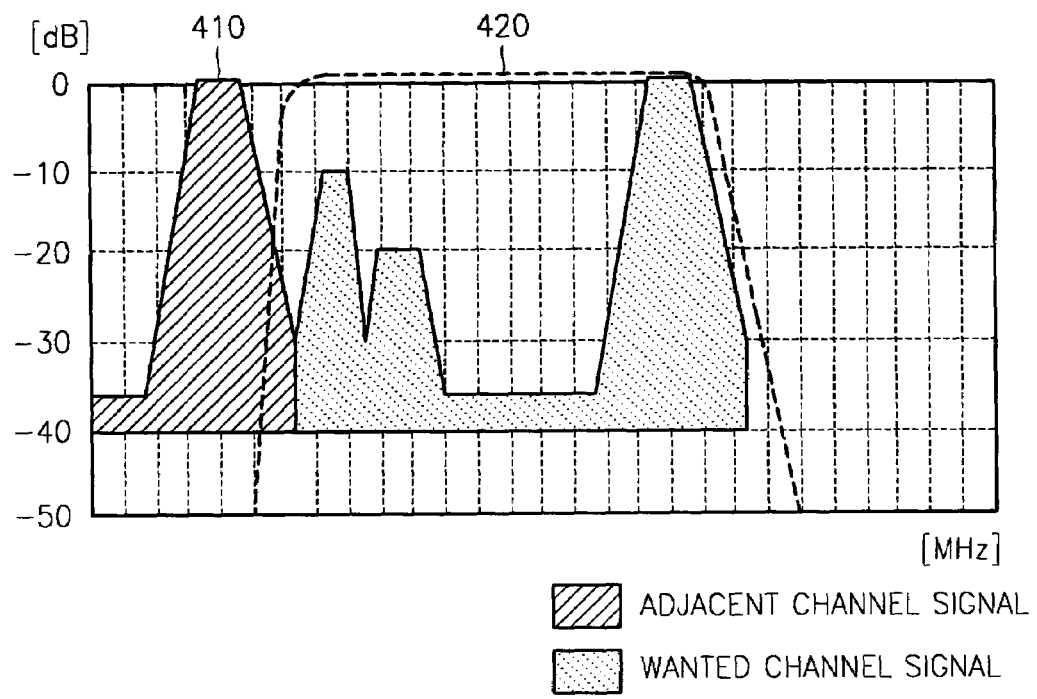
FIG. 4A shows signals to be filtered by the bandpass filter shown in FIG. 3

A bandpass filter 330 blocks adjacent channel signals 410 and noise signals among the baseband signals output from the mixer 320 and has it so that only baseband signals 420 corresponding to the selected channel via the tuner 210 passes, as shown in FIG. 4A. Accordingly, the bandpass filter 330 has it so that only the IF signals of the corresponding channel pass.

An analog-to-digital converter (ADC) 342 converts the analog baseband signals output from the bandpass filter 330 into digital baseband signals.

Figure 4B:
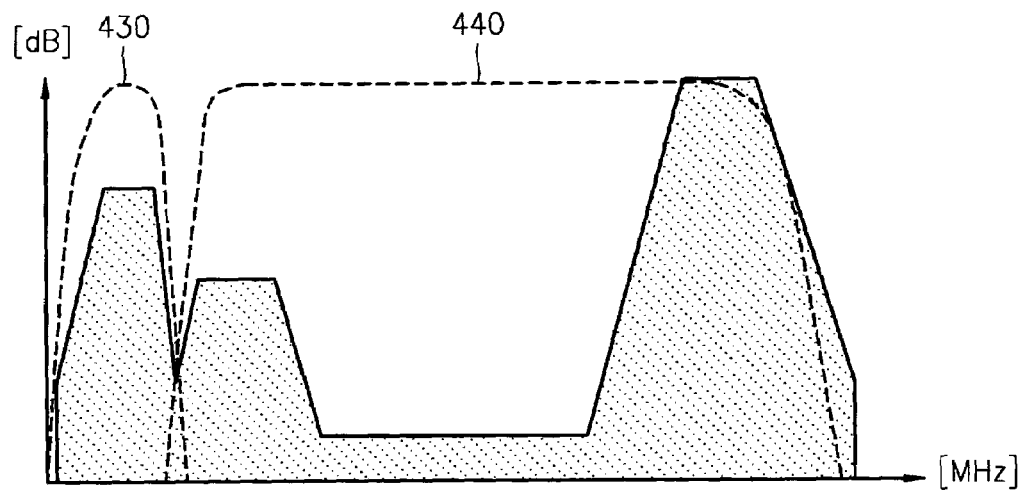
FIG. 4B shows signals to be filtered by the digital filter shown in FIG. 3.

A digital filter 344 separates the digital baseband signals output from the ADC 342 into video signals 440 and sound signals 430, as shown in FIG. 4B, using a predetermined digital filtering algorithm. Here, the digital filtering algorithm extracts required characteristics by processing the digital IF signals via adequate operations, such as, adding, multiplying, delaying, etc., according to filtering coefficients applied from the controller 280. A first digital-to-analog converter (DAC) 346 converts the digital video signals output from the digital filter 344 into analog video signals and a second DAC 348 converts the digital sound signals output from the digital filter 344 into analog sound signals.

As described above, according to the present invention, since TV signals and FM radio signals can be selectively received using a single tuner, production cost can be saved while usability can be improved. Further, when an FM radio signal is input, it is possible to produce secondary sound IF signals using a primary sound IF component, without a video IF component.

While the present invention has been particularly shown and described with reference to exemplary embodiments thereof, it will be understood by those of ordinary skill in the art that various changes in form and details may be made therein without departing from the spirit and scope of the present invention as defined by the appended claims.

What is claimed is:

1. A combined television (TV) and frequency modulation (FM) radio receiver, comprising:
   a tuner that selects TV band signals or FM radio band signals and converts the selected TV band signals into intermediate frequency (IF) signals if the TV band signals are selected and converts the selected FM radio band signals into primary sound IF signals if the FM radio band signals are selected;
   an IF processor that generates first local oscillating signals if a current mode is a TV mode and generates second local oscillating signals if the current mode is an FM radio mode, and converts the IF signals into first baseband signals and first secondary sound IF signals, and/or converts the primary sound IF signals into second secondary sound IF signals;
   a video demodulator that extracts video signals from the first baseband signals output from the IF processor;
   an audio demodulator that extracts TV audio signals from the first secondary sound IF signals according to TV sound mode data and/or FM audio signals from the second secondary sound IF signals output from the IF processor according to FM radio mode data; and a controller that controls the selection of the tuner based on TV channel selection data or FM radio channel selection data, controls the IF processor to generate the first local oscillating frequency signals if the current mode is the TV mode and generate second local oscillating frequency signals if the current mode is the FM radio mode, and applies the TV sound or FM radio mode data to the audio demodulator.

2. The combined TV and FM radio receiver of claim 1, further comprising a surface acoustic wave (SAW) filter passing TV video and audio band signals from the IF signals, or FM radio band signals from the primary sound IF signals, output from the tuner, and the IF processor converts the TV video and audio signals into first baseband signals and first secondary sound IF signals, respectively, or the primary sound IF signals into second secondary sound IF signals.

3. The combined TV and FM radio receiver of claim 1, wherein the IF processor includes:

a local oscillator that generates one of the first and second local oscillating signals for respective TV mode and FM radio mode, wherein the TV and FM radio modes are predetermined;

a mixer that mixes the first oscillating signals with the IF signals to generate second baseband signals if the current mode is the TV mode, and mixing the second oscillating signals with the primary sound IF signals to generate the second secondary sound IF signals, if the current mode is the FM radio mode, as mixing results;

an analog-to-digital converter (ADC) that converts the second baseband signals output from the mixer into digital baseband signals;

a digital filter that separates the digital baseband signals output from the ADC into video signals and sound signals via a predetermined digital filtering algorithm;

a first digital-to-analog converter (DAC) that converts the digital video signals output from the digital filter into analog video signals; and a second DAC that converts the digital sound signals output from the digital filter into analog sound signals.

4. The combined TV and FM radio receiver of claim 3, further comprising a bandpass filter passing baseband signals of a selected channel among the second baseband signals output from the mixer, wherein the analog-to-digital converter (ADC) converts the baseband signals of the selected channel output from the mixer into the digital baseband signals.

5. The combined TV and FM radio receiver of claim 1, wherein the audio demodulator extracts the TV sound signals from the first secondary sound IF signals via quadrature demodulation and extracts the FM audio signals from the second secondary sound IF signals via FM phase locked loop (PLL) demodulation.

6. The combined TV and FM radio receiver of claim 1, wherein the controller produces an on-screen display (OSD) that displays predetermined information including channel information, when in the FM radio mode.

7. A combined television (TV) and frequency modulation (FM) radio receiver, comprising:

means for tuning including selecting TV band signals or FM radio band signals and converting the selected TV band signals into intermediate frequency (IF) signals if the TV band signals are selected and converting the selected FM radio band signals into primary sound IF signals if the FM radio band signals are selected;

means for processing signals including generating first local oscillating signals if a current mode is a TV mode and generating second local oscillating signals if the current mode is an FM radio mode, and converting the IF signals into first baseband signals and first secondary sound IF signals, and/or converting the primary sound IF signals into second secondary sound IF signals;

means for extracting video signals from the baseband signals output from the means for processing signals;

means for extracting audio signals including extracting TV audio signals from the first secondary sound IF signals according to TV sound mode data and/or extracting FM audio signals from the second secondary sound IF signals according to FM radio mode data; and means for controlling including controlling the means for tuning based on TV channel selection data or FM radio channel selection data, controlling the means for processing signals to generate the first local oscillating frequency signals if the current mode is the TV mode and generate second local oscillating frequency signals if the current mode is the FM radio mode, and applying one of the TV sound and FM radio mode data to the means for extracting audio signals.

8. A method of processing television (TV) and frequency modulation (FM) radio signals, said method comprising:

selecting one of TV band signals and FM radio band signals;

converting the selected TV band signal into intermediate frequency (IF) signals if the TV band signals are selected and converting the selected FM radio band signals into primary sound IF signals if the FM radio band signals are selected;

generating first oscillating signals if a current mode is a TV mode and generating second oscillating signals if the current mode is an FM radio mode;

converting the IF signals into first baseband signals and first secondary sound IF signals, and/or the primary sound IF signals into second secondary sound IF signals;

extracting video signals from the baseband signals;

extracting TV audio signals from the first secondary sound IF signals according to TV sound mode data and/or extracting FM audio signals from the second secondary sound IF signals according to FM radio mode data; and controlling the selecting of one of TV band signals and FM radio band signals based on TV channel selection data or FM radio channel selection data;

controlling the generating of first and second local oscillating frequency signals depending on the current mode; and controlling the extracting of TV audio signals and the extracting of FM radio signals by applying the TV sound mode data and the FM radio mode data, respectively.

* * * * *